(12) United States Patent
Shapoury et al.

(10) Patent No.: US 10,476,452 B2
(45) Date of Patent: Nov. 12, 2019

(54) ADJUSTABLE LOAD LINE POWER AMPLIFIER CIRCUITS AND METHODS

(71) Applicant: The Boeing Company, Chicago, IL (US)

(72) Inventors: Alireza Shapoury, Rancho Palos Verdes, CA (US); Brian Kenneth Kormanyos, Edmonds, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/801,202

(22) Filed: Nov. 1, 2017

(65) Prior Publication Data

US 2019/0131939 A1    May 2, 2019

(51) Int. Cl.
| | |
|---|---|
| *H03F 3/193* | (2006.01) |
| *H03F 3/217* | (2006.01) |
| *H03F 1/02* | (2006.01) |
| *H03F 1/56* | (2006.01) |
| *H01Q 3/26* | (2006.01) |
| *H01Q 3/28* | (2006.01) |
| *H01Q 21/00* | (2006.01) |
| *H01Q 5/378* | (2015.01) |

(52) U.S. Cl.
CPC ......... *H03F 3/193* (2013.01); *H01Q 3/2658* (2013.01); *H01Q 3/28* (2013.01); *H01Q 5/378* (2015.01); *H01Q 21/0025* (2013.01); *H03F 1/0205* (2013.01); *H03F 3/2171* (2013.01); *H03F 3/2176* (2013.01); *H03F 2200/393* (2013.01); *H03F 2200/451* (2013.01)

(58) Field of Classification Search
USPC ............... 330/124 R, 295, 84, 302, 286
See application file for complete search history.

(56) References Cited

U.S. PATENT DOCUMENTS

| 7,417,598 B2 | 8/2008 | Navarro et al. |
| 8,150,343 B2 * | 4/2012 | Ramachandra Reddy ........... H03F 1/0227 455/107 |

(Continued)

OTHER PUBLICATIONS

R. Lossy et al., "Gallium nitride powerbar transistors with via voles fabricated by laser ablation," Phys. Stat. Sol. (C), No. 3, 482-485, 2006.

(Continued)

*Primary Examiner* — Hieu P Nguyen
(74) *Attorney, Agent, or Firm* — Dascenzo Intellectual Property Law, P.C.

(57) ABSTRACT

Adjustable load line amplifier circuits may comprise a power amplifier that has a signal input terminal to receive an input signal, a powered signal output terminal to be coupled to a load that has changing impedances, and a transistor array of transistor cells operatively coupled in parallel between the signal input terminal and the powered signal output terminal such that the transistor cells are independently configured to amplify the input signal present at the signal input terminal and effect a selected load line impedance of the transistor array that corresponds to at least one of the changing impedances of the load. The transistor array controller may be configured to effect the selected load line impedance by selectively activating one or more of the transistor cells and/or providing the transistor cells with a selectable operating voltage.

18 Claims, 4 Drawing Sheets

(56) References Cited

U.S. PATENT DOCUMENTS 8,643,554 B1      2/2014   Manry, Jr. et al.
9,246,454 B2 *    1/2016   Schirmann .............. H03F 3/602
9,294,056 B2 *    3/2016   Nobbe .................. H03F 1/0261

OTHER PUBLICATIONS

F. Raab, et al., "Power Amplifiers and Transmitters for RF and Microwave," IEEE Transactions on Microwave Theory and Techniques, vol. 50, No. 3, Mar. 2002.
S. Cripps, "A Theory for the Prediction of GaAS FET Load-Pull Power Contours," IEEE MTT-S Digest, G-7, 1983.
G. Borgiotti et al., "Modal Analysis of Periodic Planar Phased Arrays of Apertures," Proceedings of the IEEE, vol. 56, No. 11, Nov. 1968.

* cited by examiner

ADJUSTABLE LOAD LINE POWER AMPLIFIER CIRCUITS AND METHODS

FIELD

The present disclosure relates to adjustable load line power amplifier circuits and methods.

BACKGROUND

Radio frequency (RF) power amplifiers may encounter antennas or other loads with impedances that may change in a number of ways. The environment around a given antenna or load may change due to environmental conditions such as the formation of ice. The antenna of a mobile device may be placed near a large metal object. Different antennas, radiating elements, or loads may be used in different applications or installations. Antenna impedance can also change when multiple antennas are used in arrays. A phased array antenna is an antenna system, having multiple radiation elements, in which the radiation pattern can be steered in particular directions by controlling the relative phases of the signal delivered to the radiation elements. The impedance of the antenna array elements in a phased array antenna changes as the array is scanned. A phased array antenna may be used for radar systems, communication systems, etc. In addition, impedance of a load may be a factor in lower frequency power amplifiers, including amplifiers operating at ultrasonic and audio frequencies.

Power amplifiers provide an amplified signal to an antenna or to other loads. According to linear circuit theory, optimum power transmission between the power amplifier (the source) and the load is achieved when the output impedance of the power amplifier (the load line impedance) is matched to the input impedance of the load (the load impedance) resulting in minimum reflection in a transmission line sense. However, as signal amplitude is increased, the voltage and current limits of the power amplifier become the dominant factor. The power amplifier will show better linearity and higher power output if the real and imaginary parts of the load impedance are consistent with the voltage and current limits of the device and the reactive (capacitive and inductive) parasitics contained in the device. The optimum condition results in the largest range of both voltage and current and is known as the load line match. The load line is the locus of points in the current-voltage plane where the device will operate for a specific given load. This locus of points can be overlaid on the current-voltage curves of the device, for example from a curve tracer. For purely resistive loads the resulting locus is a straight line, the load line. For typical devices the optimum load line runs from the highest device current at the low end of its voltage range to the lowest device current at the high end of its voltage range.

The power amplifier load line and the actual impedance of the load are usually different. A impedance matching network or device is used to transform the load impedance to the impedance of the optimum load line at the device. This will optimize power transfer between the power amplifier and load in large signal conditions. Matching to the load line impedance (through design of the power amplifier, and/or the impedance matching network) provides benefits such as increased power delivery, better efficiency, reduced localized heating (e.g., due to power loss), and increased linearity, and/or reduced inadvertent phase change with amplitude and intermodulation products.

Impedance matching may be achieved with a static impedance design (assuming the power amplifier and the load have unvarying impedances) or may be achieved with a tunable impedance design. For example, impedance matching networks may be formed of resistors, inductors, and/or capacitors (passive devices) configured to adapt the output impedance of a power amplifier into the input impedance of a load. If the resistors, inductors, and/or capacitors have static values, the impedance matching network will likewise have a static impedance conversion (e.g., at a particular frequency). If the output impedance of the power amplifier or the input impedance of the load changes, the static impedance matching network will not properly adapt the impedance between the source and load. However, there will be a one to one correspondence between the impedance at the load (e.g., antenna) and the impedance seen at the amplifying device through the transformation of the matching network. If one or more of the inductors and/or capacitors are adjustable (a tunable device), the impedance matching network can be changed to accommodate some differences in the impedance of the load to keep the impedance matched to the load line of the amplifying device.

Impedance matching networks inherently dissipate some of the power in the signal emitted from the power amplifier. Mechanically adjustable impedance matching devices can be as low in loss as fixed tuned elements. But electronically adjustable impedance matching devices are much more susceptible to the problem of loss, for example varactor diode capacitors and they may be expensive and bulky in the case of adjustable inductors or magnetic components. Electronically tunable impedance matching elements like these are generally considered impractical for most power amplifier applications.

Though static Impedance matching is efficient and low cost, and many types of loads, such as phased array antennas and antennas on mobile devices, have variable impedances that may vary significantly. For example, a phased array antenna may have an impedance variation of greater than a factor of four depending on the direction and/or type of the radiation pattern emitted. In certain cases, the loss caused by mismatched impedances may be so great that it can result in "scan blindness" in phased array antennas (where the active radiation pattern of the array may have minima at certain angles).

Hence, there is a need for efficient and adjustable load line matching systems and methods.

SUMMARY

Adjustable load line amplifier circuits may comprise a power amplifier that has a signal input terminal to receive an input signal, a powered signal output terminal to be coupled to a load that has a changing or changeable impedance, and a transistor array of transistor cells operatively coupled in parallel between the signal input terminal and the powered signal output terminal such that the transistor cells are configured independently so that one or more of the transistor cells amplify the input signal present at the signal input terminal and contribute to a powered transmit signal current at the powered signal output terminal. Amplifier circuits and/or transmission systems including such amplifier circuits may be configured to effect a selected load line impedance of the transistor array that corresponds to the impedance of the load at a given time. A transistor array controller is configured to effect the selected load line impedance by selectively activating one or more of the transistor cells to adjust the maximum current to the load under high drive conditions, while the voltage of the power supply is adjusted to independently control the maximum voltage swing. Independent control of maximum current, by switching in more transistor cells, and selection of the maximum voltage of the power supply, provide adjustment of the load line impedance.

Methods of load line matching may comprise receiving an input signal, determining a present impedance of a load, and selectively controlling one or more transistor cells of a transistor array of a power amplifier and the power supply voltage. The selectively controlling is in response to the present or current impedance of the load. Selectively controlling the transistor cells and power supply voltage amplifies the input signal to a powered transmit signal and provides the powered transmit signal to a powered signal output terminal of the power amplifier with a selected load line impedance that corresponds to the present impedance of the load. The powered signal output terminal of the power amplifier is coupled to the load.

DESCRIPTION

Figure 1:
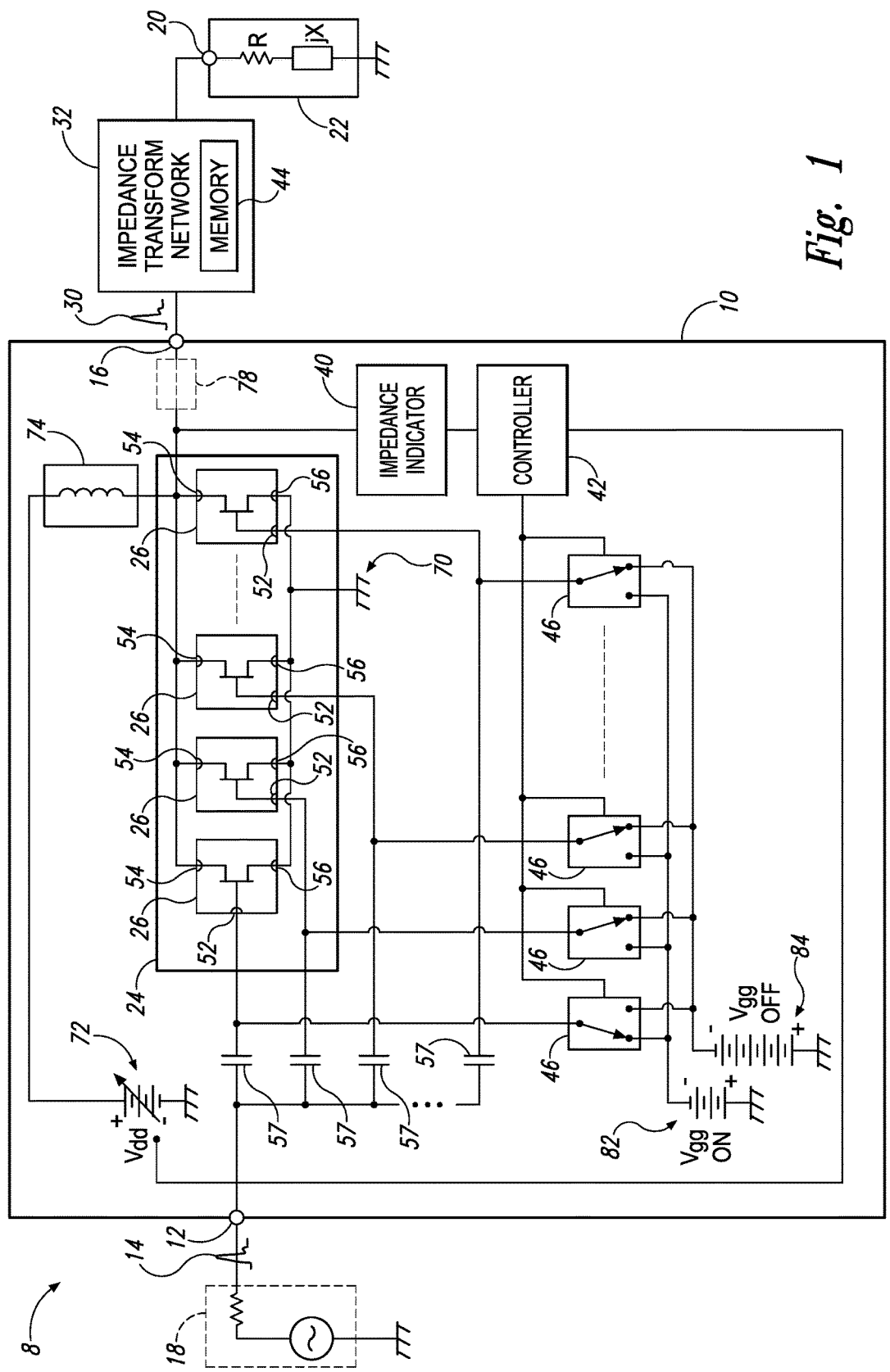
FIG. 1 is a block diagram of a transmission system including an amplifier circuit with a transistor array of transistor cells.

Adjustable load line amplifier circuits facilitate delivering power signals to a load using dynamic load line matching. The amplifier circuits incorporate an array of transistor cells (e.g., each a single-stage transistor amplifier) in which the number of active transistor cells and the operating conditions of the transistor cells may be selectively and dynamically changed to maintain a load line impedance that is matched to the impedance of the load. In elementary terms, the output voltage amplitude of the amplifier circuit may be substantially controlled by the operating voltage of the transistor cells and the output current amplitude of the amplifier circuit may be substantially controlled by the number of active transistor cells.

FIGS. 1-4 illustrate transmission systems, amplifier circuits, and methods for dynamic load line matching. In general, in the drawings, elements that are likely to be included in a given embodiment are illustrated in solid lines, while elements that are optional or alternatives are illustrated in dashed lines. However, elements that are illustrated in solid lines are not essential to all embodiments of the present disclosure, and an element shown in solid lines may be omitted from a particular embodiment without departing from the scope of the present disclosure. Elements that serve a similar, or at least substantially similar, purpose are labelled with numbers consistent among the figures. Like numbers in each of the figures, and the corresponding elements, may not be discussed in detail herein with reference to each of the figures. Similarly, all elements may not be labelled or shown in each of the figures, but reference numerals associated therewith may be used for consistency. Elements, components, and/or features that are discussed with reference to one or more of the figures may be included in and/or used with any of the figures without departing from the scope of the present disclosure.

FIG. 1 is a block diagram of transmission system 8 that includes an amplifier circuit 10 operatively coupled to a transmit load 22. Amplifier circuit 10 includes a transmit signal input 12 (also called a signal input terminal) to receive a transmit signal 14 from a signal source 18. Transmit signal 14 is an input signal (provided by signal source 18) that is to be amplified by amplifier circuit 10 and is to be provided in amplified form as powered transmit signal 30 to transmit load 22 (also called a load). Amplifier circuit 10 includes a variable impedance output 16 (also called a powered signal output terminal) to be coupled to a transmit load input 20 (also called a powered signal input terminal) of transmit load 22. Transmit load input 20 has changing impedances (also called changing load impedance or variable impedance). The particular, current, or present impedance of transmit load 22 at transmit load input 20 depends on operating conditions of transmit load 22. Transmit load 22 may have different impedances at different times while amplifier circuit 10 and/or transmission system 8 is operating to transfer transmit signal 14 to transmit load 22 as powered transmit signal 30. Amplifier circuit 10 may be adapted and/or may be controlled to produce powered transmit signal 30 with an impedance that corresponds (i.e., impedance matched) to the present impedance of transmit load 22.

Amplifier circuit 10 includes, and/or may be, a power amplifier, which is an amplifier configured to transmit a power signal rather than merely a voltage signal. A power amplifier may be referred to as a large signal amplifier. Amplifier circuit 10 is configured to amplify a high frequency signal (transmit signal 30) that typically has frequency components (e.g., a dominant frequency component) in radio frequencies to microwave frequencies, for example at least 1 MHz (megahertz), at least 100 MHz, at most 10 GHz (gigahertz), at most 30 GHz, at most 100 GHz, and/or at most 500 GHz. Transmit signal 14 may include, and/or may be essentially, a single frequency, a narrow band of frequencies, an amplitude modulated signal, a frequency modulated signal, a phase modulated signal, a pulse train, and/or an impulsive signal. Transmit signal 14 may include a DC bias. Transmit signal 14 may be composed of a series of signal segments. Signal segments may be repetitive and/or each signal segment may have different signal characteristics (e.g., frequency, amplitude, etc.).

Amplifier circuit 10 includes a transistor array 24 of multiple transistor cells 26 coupled between transmit signal input 12 and variable impedance output 16. In the example of FIG. 1, four of multiple transistor cells 26 are shown, but transistor array 24 may have any suitable number of transistor cells 26, for example, at least 2, at least 4, at least 8, or at least 20. Generally, transistor array 24 has less than 100 transistor cells 26. The number of suitable transistor cells 26 generally is a balance between sufficient numbers of transistor cells 26 to provide versatile output impedance, to deliver power efficiently, and/or system complexity.

Transistor cells 26 are each configured as a transistor amplifier, and typically each is a single-stage transistor amplifier. Transistor cells 26 each have a first transistor cell terminal 52 to receive transmit signal 14 and a second transistor cell terminal 54 to provide at least a portion of powered transmit signal 30 to variable impedance output 16. Transistor cells 26 are supplied operating voltage and current through second transistor cell terminal 54 and third transistor cell terminal 56. Transistor cells 26 are operatively coupled in parallel between transmit signal input 12 and variable impedance output 16 such that each one of transistor cells 26 independently is configured to amplify transmit signal 14 present at transmit signal input 12 and to contribute to powered transmit signal 30 at variable impedance output 16. That is, transistor cells 26 are configured to amplify transmit signal 14 in parallel. Transistor cells 26 are not configured as serial stages of a multi-stage amplification scheme. First transistor cell terminals 52 are each operatively coupled to transmit signal input 12, typically via a coupling capacitor 57. Second transistor cell terminals 54 are each operatively coupled to variable impedance output 16, typically via one or more summing junctions.

Transmission system 8 and/or amplifier circuit 10 may be configured to supply the same operating voltage to each of transistor cells 26. For example, a first common voltage source 70 may be configured to supply a first common voltage (e.g., ground) to each of transistor cells 26 at the respective third transistor cell terminals 56 (as shown in the example of FIG. 1) and/or a second common voltage source 72 may be configured to supply a second common voltage to each of transistor cells 26 at the respective second transistor cell terminals 54 (as also shown in the example of FIG. 1). First common voltage source 70 and second common voltage source 72 are supplies of different electrical potential and may be sourced from different terminals of a single power supply (e.g., the positive and negative terminals of a power supply). First common voltage source 70, second common voltage source 72, and the combined (single) power supply are each operating voltage and/or power sources. In the illustrated example, the first common voltage source 70 is at ground potential and/or may be connected to a signal and/or device return path, and the second common voltage source 72 is a variable voltage source.

In some examples, a common first voltage, a common second voltage, and/or a common voltage difference (between second transistor cell terminal 54 and third transistor cell terminal 56) may be supplied to all or a subset of transistor cells 26. Common voltages may be distributed by an interconnecting (low impedance) conductor such as a power bus. Transistor array 24 and/or amplifier circuit 10 may include one or more transistor powerbars, which are arrays of substantially identical transistor cells 26 coupled to one or more power buses to distribute the same operating voltages to each of the transistor cells 26. The power buses of transistor powerbars supply essentially the same voltages to the individual transistor cells with little voltage drop and/or localized heating between transistor cells 26. A transistor powerbar may include a common (low impedance) conductor interconnecting two or more (e.g., all) second transistor cell terminals 54 of the transistor cells 26.

One or more of transistor cells 26 may be selectively activated and/or enabled (individually or in any combination) to amplify transmit signal 14 to powered transmit signal 30. The output (source) impedance of amplifier circuit 10 at variable impedance output 16 is altered by the number of transistor cells 26 used to amplify transmit signal 14 and the operating conditions (e.g., operating voltage) of the active and/or enabled transistor cells 26. Hence, the number of transistor cells 26 used to amplify transmit signal 14 and the operating conditions (e.g., operating voltage) of the active and/or enabled transistor cells 26 may effect, form, and/or produce powered transmit signal 30 with a selected impedance that corresponds to (e.g., matches) the present impedance of transmit load 22.

Transmission system 8 and/or amplifier circuit 10 may include a transistor array controller 42 to selectively activate and/or enable various numbers of transistor cells 26 to amplify transmit signal 14 to powered transmit signal 30 and to provide a selected operating voltage to provide powered transmit signal 30 to the variable impedance output 16 with the selected output (source) impedance that corresponds to (e.g., matches) the present load impedance of transmit load 22. The number of transistor cells 26 that contribute to powered transmit signal 30 may correspond in elementary terms to the amount of current available in powered transmit signal 30. Hence, larger numbers of transistor cells 26 may correspond to larger currents in powered transmit signal 30. For the same operating voltage from second common voltage source 72, for example, a higher current corresponds to a smaller selected output (source) impedance of transistor array 24 and/or amplifier circuit 10. Transistor array controller 42 may include, and/or may be, a microprocessor, a microcontroller, an embedded computing system, computer-readable memory, and/or persistent computer-readable storage (e.g., a hard drive, a flash drive, etc.).

Transistor array control 42 may select various numbers of transistor cells 26 by, for example, controlling functional switches 46 that operate to permit or interrupt the conveyance of an effective transmit signal 14 to the individual transistor cells 26 according to applying to first transistor cell terminals 52 an enabling, activating or ON-gate bias 82 or a disabling, inactivating or OFF-gate bias 84. Individual functional switches 46 may be arranged to control the operation of (i.e., enable and/or activate) one or more transistor cells 26. In the example of FIG. 1, individual functional switches 46 control signal flow to individual transistor cells 26. Functional switches 46 each independently may be implemented by a wide range of circuit devices, which may include controlled (electromechanical and/or electronic) switches, relays, transistors, etc. Each individual functional switch 46 independently may be configured as a momentary switch, a bistable switch, normally open/off, and/or normally closed/on. Transistor array control 42 may be configured to individually control each transistor cell 26 (e.g., to transition between enabled and disabled states) and/or may be configured to control transistor cells 26 as groups.

Additionally or alternatively, transistor array controller 42 may selectively vary one or more operating conditions (e.g., operating voltage) of the various numbers (e.g., all) of transistor cells 26. For example, transistor array controller 42 may control the operating voltage supplied to one or more transistor cells 26 (e.g., those transistor cells 26 that are active and/or enabled) by second common voltage source 72. In alternative examples, transistor array controller 42 may control one or both of first common voltage source 70 and second common voltage source 72 to establish an operating voltage (the difference of the first common voltage and the second common voltage) across one or more (e.g., all) of transistor cells 26. The operating voltage of transistor cells 26 may correspond in elementary terms to the amount of voltage available in powered transmit signal 30. Hence, a larger operating voltage may correspond to a larger voltage in powered transmit signal 30. For the same number of active and/or enabled transistor cells 26, a larger operating voltage corresponds to a larger selected output (source) impedance of transistor array 24 and/or amplifier circuit 10.

Transistor array controller 42 may monitor and/or control the duty cycle, temperature, and active lifetime of one or more (e.g., all) of transistor cells 26. In some examples, transistor array controller 42 may selectively activate and/or enable less than all of transistor cells 26 to equalize the duty cycles, temperatures, and/or total durations of activity among the transistor cells 26. For example, a portion (e.g., half) of transistor cells 26 may be activated and enabled during a corresponding and/or selected portion of transmit signal 14 (e.g., half of corresponding signal segments) while the remainder of transistor cells 26 are disabled (which may permit the disabled transistor cells 26 to cool more rapidly). During other portions of transmit signal 14, one or more (e.g., all) of the earlier disabled transistor cells 26 may be activated and enabled, and/or one or more (e.g., all) of the earlier enabled transistor cells 26 may be disabled. Using less than all of transistor cells 26 and/or distributing the use of transistor cells 26 may permit operating with reduced cooling (because each transistor cell 26 dissipates less energy), may increase the useful lifetime of transistor array 24 (because each transistor cell 26 is used more evenly), and/or may permit transistor array 24 to be operated with damaged or otherwise malfunctioning transistor cells 26 (e.g., by disabling a damaged transistor cell 26).

In some examples, transmission system 8 and/or amplifier circuit 10 may include an impedance transformation network 32 to adapt the output (source) impedance of amplifier circuit 10 to the present load impedance of transmit load 22. Impedance transformation network 32 typically is in the signal path between variable impedance output 16 and transmit load input 20. Impedance transformation network 32 may be a passive or active device, and may include discrete, lumped, and/or distributed impedance elements (e.g., resistors, inductors, capacitors, and/or transmission lines). Passive devices and/or passive elements may have higher power transmission and/or efficiency relative to active devices and/or active elements. Because amplifier circuit 10 is configured to dynamically change output (source) impedance to adapt to changes in the load impedance, impedance transformation network 32 may be a passive device and yet transmission system 8 may remain substantially impedance matched (between amplifier circuit 10 and transmit load 22).

Impedance transformation network 32 may include, and/or may be, an impedance transformer. An impedance transformer generally is passive and generally has higher power transmission and/or power transmission efficiency than corresponding load line matching devices based on impedance elements. Generally, an impedance transformer provides a one-to-one impedance mapping between the device input (variable impedance output 16) and the device output (transmit load input 20).

Transmit load 22 may include, and/or may be, one or more of an antenna, a transmitter, and/or a transducer. For example, transmit load 22 may be all or a portion of an antenna array and/or a phased array antenna. Transmission system 8 and/or transmit load 22 may be all or a portion of a phased array transmitter, a communication system (e.g., employing orthogonal frequency-division multiplexing (OFDM)), a radar system (e.g., airborne, ranging, ground-penetrating, etc.), an electronic warfare (e.g., jamming) system, a radio astronomy system, a multiband transmitter, a sensing system, and/or a portable system. Changing load impedances may arise under any of a variety of circumstances that may include one or more antennas being exposed to various environmental conditions (sun, shade, temperature differentials, ambient temperature, ambient humidity, target composition, environmental objects, etc.). For example, a phased array antenna may exhibit different load impedances for different emitted beam angles (e.g., a wide field of regard system may have a large impedance change between a boresight beam and an inclined beam). Further, phased array antennas may have electrical coupling between radiation elements (e.g., due to proximity of the elements) that leads to constructive interference, destructive interference, and/or resonance between the radiation elements and that causes the impedance of the phased array antenna (and/or individual radiation elements) to significantly change, As another example, mobile devices and/or transmit loads 22 may experience different impedances based on the proximity of people, vegetation, buildings, vehicles, etc. Furthermore, transmission system 8, amplifier circuit 10, and/or transmit load 22 may be subject to environmental aging, wear, and/or damage that causes the load impedance to change over the service life of the transmission system 8.

Transmission system 8 and/or amplifier circuit 10 may include a load impedance indicator 40 to provide an indication of the present load impedance of transmit load 22. Transistor array controller 42 may include and/or may communicate with load impedance indicator 40 to selectively enable and/or activate one or more of transistor cells 26 responsive to the indication of the present load impedance provided by load impedance indicator 40. The indication of the present load impedance may correspond to the (complex) value of the present load impedance, the magnitude of the present load impedance, the resistance (real portion) of the present load impedance, the reactance (imaginary portion) of the present load impedance, and/or a phase of the present load impedance. Frequency dependent indications of the present load impedance may be at a predefined frequency, at a dominant frequency of transmit signal 14, and/or at 'infinite' frequency (high frequency limit). Load impedance indicator 40 may include, and/or may be, a microprocessor, a microcontroller, an embedded computing system, computer-readable memory, persistent computer-readable storage (e.g., a hard drive, a flash drive, etc.), an analog to digital converter, an ohmmeter, and/or a spectrum analyzer.

In some examples, load impedance indicator 40 provides the indication of the present load impedance of transmit load 22 based on a measurement of the present load impedance. In other examples, load impedance indicator 40 provides the indication of the present load impedance of transmit load 22 based on one or more characteristics of transmit signal 14, powered transmit signal 30, and/or transmit load 22. Examples of suitable characteristics may include and/or relate to transmission angle, transmission range, transmission frequency content, target location (e.g., angle and/or range), operating and/or environmental temperature, transmission power, and/or repetition rate. It will be appreciated that in other examples other characteristics may be used. A predetermined load input impedance indication may be selected or determined based on one or more of these characteristics. In some examples, plural predetermined load input impedance indications may be stored in and retrieved from an optional memory component 44 (volatile and/or persistent computer-readable memory) that may be included in load impedance indicator 40.

Transmission system 8 and/or amplifier circuit 10 may include an output coupler 78 to isolate powered transmit signal 30 from signals within transmission system 8 and/or amplifier circuit 10. Output coupler 78 may be an AC coupler, such as coupling capacitors 57, that substantially passes the AC signal of respective transmit signal 14 and powered transmit signal 30. AC couplers substantially block DC signals. Hence, DC voltages applied within amplifier circuit 10 may be isolated from the AC signals of transmit signal 14 and/or powered transmit signal 30. AC couplers may include, and/or may be, a capacitor. Output coupler 78 may be incorporated within impedance transformation network 32, and/or impedance transformation network 32 may serve as output coupler 78.

Additionally or alternatively, transmission system 8 and/or amplifier circuit 10 may include frequency blocking and/or transmitting devices to isolate DC signals, AC signals, transmit signal 14, and/or powered transmit signal 30 from others of the group. For example, second common voltage source 72 may incorporate and/or may be coupled to other components via a DC bias device 74 configured to attenuate or block AC signals (e.g., an inductor, an RF choke, a low-pass filter, etc.).

Figure 2:
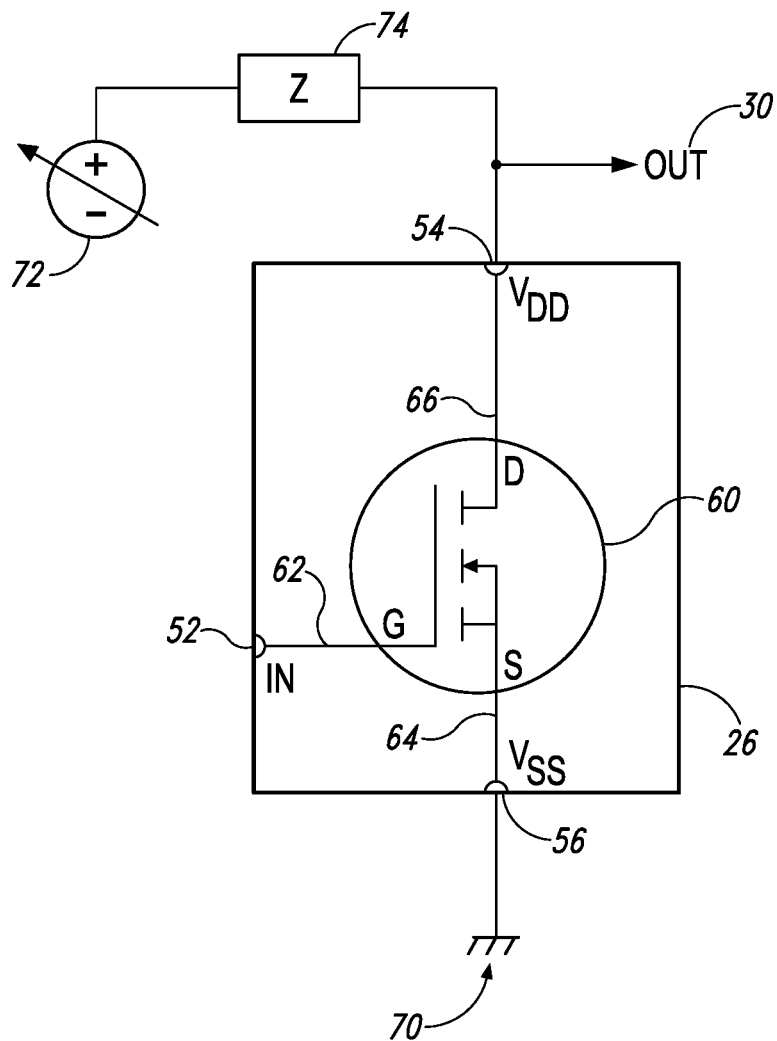
FIG. 2 is a schematic diagram of a transistor cell.

FIG. 2 is a schematic diagram of an example of transistor cell 26. Generally, each of transistor cells 26 in transistor array 24 is the same and/or includes substantially identical components and/or configurations. Each of transistor cells 26 and includes a transistor 60 configured as a transistor amplifier (generally a single-stage transistor amplifier, e.g., a common source amplifier as shown in the example of FIG. 2). Each of transistor cells 26 may include a single transistor for amplification of transmit signal 14. Corresponding transistors 60 of transistor cells 26 may be formed with the same technology (e.g., semiconductor material), have substantially the same operating voltages, have substantially the same bias voltages, and/or have substantially the same performance characteristics (e.g., frequency response, thermal response, etc.).

Though transistor 60 in the example of FIG. 2 is illustrated as a particular type of a field effect transistor (FET), transistor 60 may be any of a variety of transistor technologies, semiconductor materials, and/or semiconductor technologies, including, for example, gallium nitride (GaN), gallium arsenide (GaAs), silicon carbide (SiC), high electron mobility transistor (HEMT), metal-semiconductor FET (MESFET), metal-oxide semiconductor FET (MOSFET), metal-insulator-semiconductor FET (MISFET), insulated gate FET (IGFET), bipolar transistors, and/or monolithic microwave integrated circuit (MMIC). Some semiconductor materials and technologies (e.g., GaN) may provide high power capability, a wide band gap, a high electron mobility at saturated drift velocities, a large breakdown voltage at high frequency, and a wide range of power supply voltages. Transistors may be depletion mode type (as illustrated in and described with reference to FIGS. 1-3) or enhancement mode type (according to whether the transistor channel is conductive when the gate/base has zero bias voltage). Description of the details of transistor 60 uses the terminology and symbols of FET (e.g., gate, source, and drain) without implying any particular transistor type. For example, in the following discussion, the bipolar transistor terms base, collector, and emitter may be substituted for the corresponding FET terms gate, source, and drain.

Transistor 60 includes a gate 62, a source 64, and a drain 66. Gate 62 is connected to first transistor cell terminal 52 to receive transmit signal 14. Drain 66 is connected to second transistor cell terminal 54 to receive a transistor drain voltage, such as the common drain voltage that may be supplied by second common voltage source 72, and to provide at least part of the powered transmit signal 30. Source 64 is connected to third transistor cell terminal 56 to receive a transistor source voltage such as the common source voltage (e.g., ground) that may be supplied by first common voltage source 70.

Transistor 60 is configured to form a conductive path between drain 66 and source 64 according to the voltage between gate 62 and source 64. A gate-source voltage that is below a gate threshold voltage causes the conductive path between drain 66 and source 64 to close and, hence, transistor 60 is disabled. A gate-source voltage that is at or above the gate threshold voltage causes the conductive path between drain 66 and source 64 to open and, hence, transistor 60 is enabled.

As shown in the example of FIG. 2, transistor cell terminal 54 may be at least partially isolated from second common voltage source 72 by impedance element 74. In alternative examples, third transistor cell terminal 56 may be at least partially isolated from first common voltage source 70 (e.g., non-ground) by an impedance element analogous to impedance element 74. Independent impedance elements 74 may be associated with each of transistor cell terminals 54 may facilitate isolating the operations of transistor cells 26 from each other, so that operation of one of transistor cells 26 does not substantially affect the operation of another of transistor cells 26, particularly when transistor cells 26 are physically close, in the same package, and/or in a transistor powerbar. Impedance elements 74 each independently may include, and/or may be, a resistor, an inductor, and/or a capacitor. Impedance elements 74 each independently may be a signal splitter (e.g., DC-AC splitter, low-pass, high-pass splitter) and/or an AC blocking element (e.g., an inductor, an RF choke, etc.).

Figure 3:
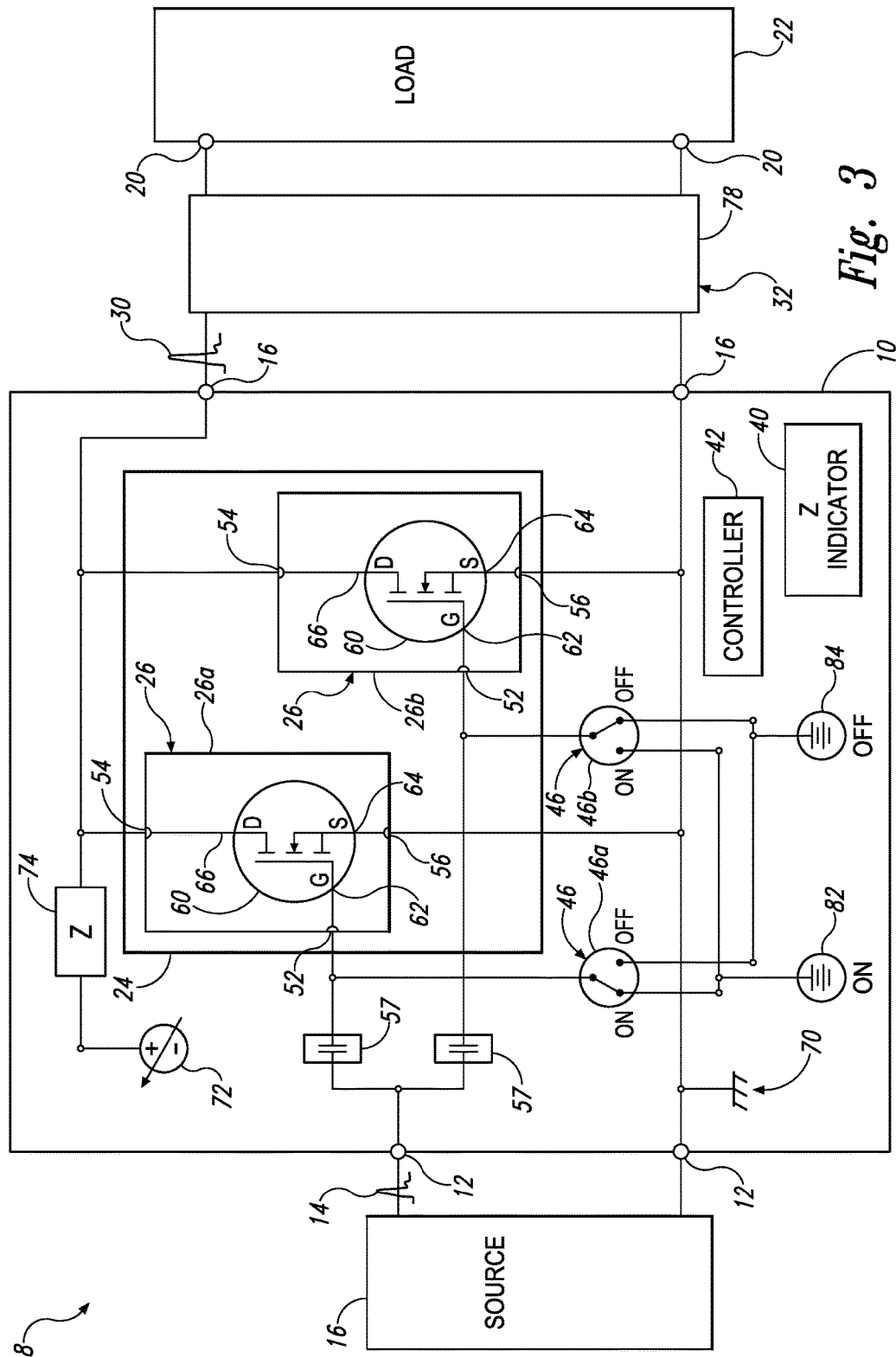
FIG. 3 is a schematic diagram of an example of an amplifier circuit.

FIG. 3 is a schematic diagram of an example of amplifier circuit 10 that includes an example transistor array 24 with two transistor cells 26 (labelled 26a and 26b) coupled between transmit signal input 12 and variable impedance output 16 to illustrate an example of selective activation and/or enablement of transistor cells 26a and 26b. Transistor array 24 of the example of FIG. 3 includes just two transistor cells 26 to clarify discussion and the drawing. As discussed herein, transistor array 24 may include a larger number of transistor cells 26. Extension to more transistor cells 26 may be by replicating transistor cells 26 and associated components. Also to clarify the drawing of FIG. 3, control and/or sense lines of transistor array controller 42 and load impedance indicator 40 are not shown in the example of FIG. 3. Transistor array controller 42 is configured to control the state of functional switches 46 and the relative voltage between first common voltage source 70 and second common voltage source 72 (e.g., the operating voltage of transistor cell 26) in response to the present impedance of the load 22 indicated by load impedance indicator 40.

In FIG. 3, transmit signal 14 is received at transmit signal input 12. Transmit signal 14 is distributed to respective transistor cell signal input terminal 52 of each transistor cell 26 via a coupling capacitor 57. Each of transistor cell input terminals 52 also is coupled to functional switch 46 (functional switches 46a and 46b for respective transistor cells 26a and 26b). Each of functional switches 46 is configured to supply one of two DC bias voltages, from either ON-gate bias 82 or OFF-gate bias 84. ON-gate bias 82 and OFF-gate bias 84 are each voltage and/or power supplies.

ON-gate bias 82 is configured to bias the respective gate 62 of selected transistor cell 26 such that transmit signal 14 is amplified by respective transistor 60 (transistor 60 is on or enabled). Hence, the DC bias voltage of ON-gate bias 82 is sufficiently large enough (relative to first common voltage source) that no part of transmit signal 14 has an instantaneous value below the gate threshold voltage of respective transistor 60. OFF-gate bias 84 is configured to bias the respective gate 62 of selected transistor cell 26 such that transmit signal 14 is not amplified by respective transistor 60 (transistor 60 is off or disabled).

As shown in the example of FIG. 3, transistor array 24 has one of two transistor cells 26 enabled and the other disabled. Transistor cell 26a is enabled because functional switch 46a is configured to apply the ON-gate bias voltage from ON-gate bias 82. Transistor cell 26b is disabled because functional switch 46b is configured to apply the OFF-gate bias voltage from OFF-gate bias 84. Thus, amplifier circuit 10 and transistor array 24 of FIG. 3 are configured to amplify transmit signal 14 with one of transistor cells 26 (specifically transistor cell 26a). Amplifier circuit 10 and transistor array 24 of FIG. 3 could be configured to amplify transmit signal 14 with both transistor cells 26 by switching functional switch 46b to apply the ON-gate bias voltage from ON-gate bias 82 (as shown in the internal state of functional switch 46a). Further, amplifier circuit 10 and transistor array 24 of FIG. 3 could be configured to amplify transmit signal 14 with the other of transistor cells 26 (specifically transistor cell 26b instead of transistor cell 26a) by switching functional switch 46a to apply the OFF-gate bias voltage from OFF-gate bias 84 (as shown in the internal state of functional switch 46b) and by switching functional switch 46b to apply the ON-gate bias voltage from ON-gate bias 82 (as shown in the internal state of functional switch 46a).

To illustrate operation of transistor arrays 24, Table 1 summarizes samples 1-1B and 2-2D of the performance of a simple transistor array 24 that includes two transistor cells 26 (such as shown in FIG. 3). The samples illustrate the effect of one or both transistor cells 26 of the array being activated ('Active Cells') at a given operating voltage ('Voltage') and load impedance ('Resistance,' the real part of the load impedance and 'Reactance,' the imaginary part of the load impedance). The performance of transistor array 24 is characterized by output power of amplifier circuit 10 at transmit load 22 at peak efficiency ('Power'), by power-added efficiency ('PAE'), and by linear amplification range ('Linearity'). Power is expressed in decibels (dB) of the powered transmit signal 30 (output). It is appreciated by those of ordinary skill in the art that the P1dB compression point may be used as a measure of linearity. The P1dB compression point is the output power at which the gain is compressed 1 dB from its small signal value. In examples 1, 1A, 1B and 2, the voltages and impedances were selected to nominally maintain output power of around +30 dBm. Maintaining constant power allows P1dB to be used as a figure of merit for linearity.

TABLE 1

| Sample | Active Cells | Voltage (Volt) | Resistance (Ohm) | Reactance (Ohm) | Power (dB) | PAE (%) | P1dB (dBm) |
|---|---|---|---|---|---|---|---|
| 1 | 2 | 10 | 54 | 28 | 30 | 58 | 28 |
| 1A | 2 | 10 | 82 | 112 | 26 | 56 | 22 |
| 1B | 2 | 15 | 82 | 112 | 30 | 61 | 24 |
| 2 | 1 | 20 | 82 | 112 | 30 | 53 | 29 |
| 2A | 2 | 20 | 54 | 28 | 32 | 29 | 31 |
| 2B | 2 | 25 | 82 | 112 | 34 | 61 | 30 |
| 2C | 2 | 25 | 82 | 76 | 35 | 58 | 34 |

Sample 1 serves as a baseline of performance. It illustrates a system with both transistor cells 26 active and with amplifier circuit 10 that is impedance matched to the load impedance. Thus, for the sample devices of Table 1, two transistor cells 26 and an operating voltage of 10 V (volts) produces an impedance match to transmit load 22 having a load impedance of 54+j28Ω (ohms).

Sample 1A represents the performance degradation that would occur if the load impedance changed from the impedance matched condition of sample 1. Relative to sample 1, the load impedance has increased to 82+j112Ω, while the operating conditions (two active transistor cells 26 and an operating voltage of 10 V) have remained the same. Due to the mismatch in impedance, the output power decreased by 4 dB and the linearity decreased to 22 dBm (relative to sample 1 at 28 dBm).

Sample 1B represents the performance recovery (relative to sample 1A) possible by recognizing the change in load impedance (relative to sample 1). In sample 1B relative to sample 1, the operating voltage is increased to 15 V to compensate for the load impedance increase to 82+j112Ω. The resulting output power remains about the same despite the change in load impedance. Additionally, the PAE increases by 3% despite the change in load impedance. The resulting linearity is degraded to 24 dBm, still worse than sample 1. Sample 1B illustrates that changing operating voltage alone (without changing the number of active transistor cells 26) may not be effective in maintaining all performance parameters for significantly different values of load impedance.

Sample 2 represents an alternate configuration to sample 1B and demonstrates further performance recovery (generally better performance than sample 1B). In sample 2 relative to sample 1B, one of transistor cells 26 is disabled, leaving only one transistor cell 26 enabled. Also, the operating voltage is increased to 20 V. Relative to sample 1, one of transistor cells 26 is disabled and the operating voltage is increased to 20 V to compensate for the load impedance increase to 82+j112Ω. The resulting output power remains about the same and the linearity increases to 29 dBm, maintaining or even improving performance relative to sample 1, despite the change in load impedance. The PAE decreases by 5%. Sample 2 illustrates that by controlling the number of active transistor cells 26 and the operating voltage, performance can be maintained for significantly different values of load impedance.

Sample 2A represents the performance degradation that may occur if a transistor array 24 operating under the conditions of sample 2 were to experience a load impedance change. In sample 2A relative to sample 2, the number of active transistor cells 26 is increased to two while leaving the operating voltage the same in response to an impedance decrease to 54+j28Ω. The extra active transistor cell 26 increases the output power by 2 dB and increases the linearity further to 31 dBm. However, the PAE dramatically decreases by 24% (more than a 40% loss relative to sample 2). Sample 1 illustrates a better overall performance than sample 2A for the same load impedance. Sample 2A illustrates that controlling only the number of active transistor cells 26 (without changing the operating voltage) is not always effective in maintaining the same performance for significantly different values of load impedance.

Sample 2B represents an alternate configuration to sample 2 in which two of the transistor cells 26 are active instead of one. Relative to sample 2, the operating voltage is also increased to 25 V. With the change in number of active transistor cells 26 and the increase in operating voltage, sample 2B increases output power by 4 dB and increases efficiency by 8% relative to sample 2. The linearity is also maintained relative to sample 2. Sample 2B illustrates that by controlling the operating voltage to compensate for the number of active transistor cells 26, performance may be significantly maintained for the same load impedance. Hence, for the same load impedance transistor array 24 may be operated in an impedance matched condition with different numbers of active transistor cells 26. More active transistor cells 26 reduces the power dissipated by any one transistor cell 26, relative to fewer active transistor cells 26.

Sample 2C represents the performance that may occur if the load impedance changes substantially but the load resistance (real portion of the load impedance) stays constant. Relative to sample 2B, the operating conditions (two active transistor cells 26 and an operating voltage of 25 V) are the same. The load impedance changes from 82+j112Ω to 82+j76Ω (relative to sample 2B). The output power increases by about 1 dB, the PAE decreases by 3%, and the linearity increases to 34 dBm. Sample 2C illustrates that adjusting operating conditions based on the load resistance may be sufficient to produce comparable performance for differing load impedances (that have the same load resistance).

Many applications with highly variable loads may encounter a wide range of reactance values. This can create a two-dimensional locus of impedances when the real and imaginary values are considered. Some examples described herein may not tune the reactance, but rather may rely on an average improvement, since many reactance values may be encountered over the operating conditions (e.g., antenna scanning, movement, etc.). Some examples described herein may handle the real part of impedance precisely. Lower frequency applications may have insignificant reactive impedance or impedance variations.

Different performance parameters may be more important depending on the application of amplifier circuit 10 and transmission system 8. Increased linearity may be useful for communication systems. High duty cycles (e.g., continuous operation) may be better optimized with increased efficiency (e.g., PAE) at the expense of linearity and/or output power. Impulsive waveforms and high power systems (e.g., radar) may be better optimized with increased output power at the expense of linearity and/or efficiency. The greatest power output for a given load impedance may be achieved by activating all transistor cells 26 and increasing the voltage.

Figure 4:
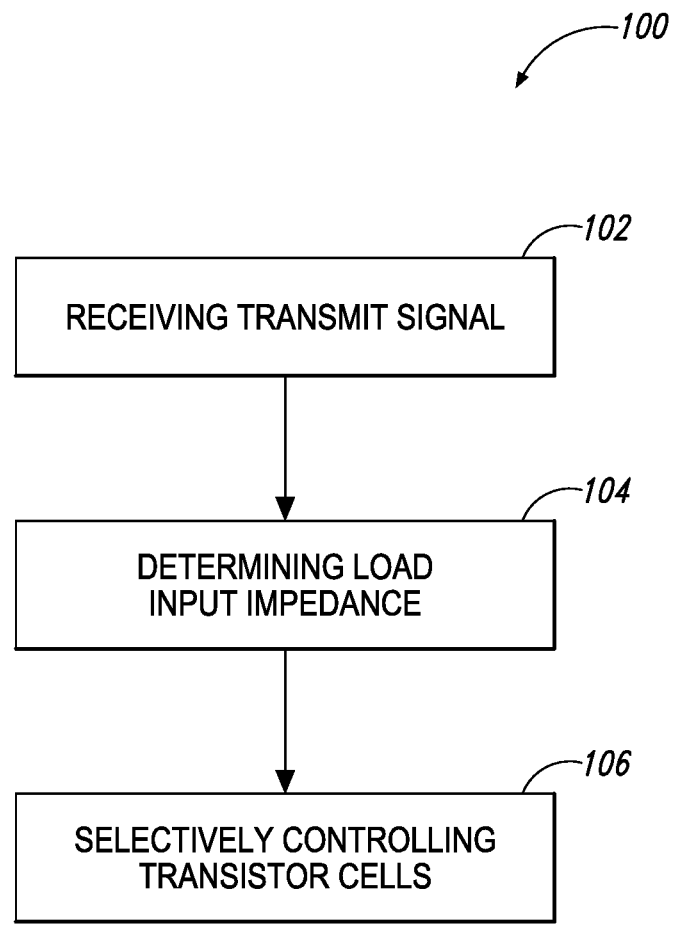
FIG. 4 is a flowchart illustrating an example load line amplifying method.

FIG. 4 is a flowchart illustrating an example load line matching method 100. Method 100 includes receiving 102 a transmit signal (e.g., transmit signal 14), and determining 104 a (present) load impedance of a transmit load (e.g., transmit load 22). The transmit load has changing load impedances and the (present) impedance of the load is at least one of the changing load impedances. The present load impedance is the actual, currently active or exhibited load impedance. Method 100 further includes selectively controlling 106 one or more transistor cells (e.g., transistor cells 26) of a transistor array (e.g., transistor array 24), in response to the (present) load impedance. Selectively controlling 106 the one or more transistor cells of the transistor array may include activating one or more of the transistor cells and/or providing a selectable operating voltage to amplify the transmit signal to a powered transmit signal (e.g., powered transmit signal 30) and provide the powered transmit signal to a variable impedance output (e.g. variable impedance output 16) with a selected output (source) impedance corresponding to the (present) load impedance, wherein the variable impedance output is operatively coupled to the transmit load (e.g., at transmit load input 20).

In some embodiments, determining 104 the (present) load impedance of the transmit load may include measuring the present load impedance at the transmit load input of the transmit load. In other embodiments, determining the (present) load impedance may include obtaining a predetermined load impedance indication based on one or more characteristics of at least the transmit signal, as described herein.

In some examples, the powered transmit signal includes plural successive signal segments and selectively controlling 106 one or more of the transistor cells of the transistor array includes selectively activating one or more different transistor cells during immediately successive signal segments. Such examples may include operations employing relatively high power, such as in some radar systems. In other examples, each of the plural input impedances may include a real impedance portion. Determining 104 the (present) load impedance of the transmit load may include obtaining an indication of the real impedance portion of the changing load impedances.

Examples of inventive subject matter according to the present disclosure are described in the following enumerated paragraphs.

A1. An amplifier circuit, comprising:
a transmit signal input to receive a transmit signal;
a variable impedance output to be coupled to a transmit load input of a transmit load, wherein the transmit load input has changing impedances; and
a transistor array of transistor cells coupled between the transmit signal input and the variable impedance output with one or more of the transistor cells to be selectively activated with a selected operating voltage to amplify the transmit signal to a powered transmit signal and to provide the powered transmit signal to the variable impedance output with a selected output impedance corresponding to a present impedance of the transmit load input.

A2. The amplifier circuit of paragraph A1, further comprising a load impedance indicator to provide an indication of the present impedances of the transmit load input, and a transistor array controller responsive to the load impedance indicator to selectively activate one or more of the transistor cells of the transistor array to amplify the transmit signal to the powered transmit signal and to provide the powered transmit signal to the variable impedance output with the selected output impedance corresponding to the present impedance of the transmit load input.

A3. The amplifier circuit of paragraph A2, wherein the load impedance indicator provides the indication of the present impedance of the transmit load input based on an impedance measurement of the transmit load.

A4. The amplifier circuit of paragraph A2, wherein the load impedance indicator provides the indication of the present impedance of the transmit load input as a predetermined load input impedance indication based on one or more characteristics of the transmit signal.

A5. The amplifier circuit of paragraph A4, wherein the load impedance indicator obtains the indication of the present impedance of the transmit load input from a stored plurality of predetermined load input impedance indications based on the one or more characteristics of the transmit signal.

A6. The amplifier circuit of any of paragraphs A2-A5, wherein the load impedance indicator is to provide an indication of a real impedance portion of the present impedance of the transmit load input.

A7. The amplifier circuit of any of paragraphs A1-A6, wherein the transmit signal includes plural successive signal segments and the transistor array controller is to selectively activate one or more different transistor cells of the transistor array during immediately successive signal segments.

A8. The amplifier circuit of any of paragraphs A1-A7, wherein each of the transistor cells has a disabled state in which the transistor cell is inactivated and does not contribute to the powered transmit signal, and an enabled state in which the transistor cell is activated and contributes to the powered transmit signal, and wherein at least one of the transistor cells is transitioned between the enabled state and the disabled state independent of at least one other of the transistor cells.

A9. The amplifier circuit of paragraph A8, wherein each of the transistor cells is independently addressable to transition between the enabled state and the disabled state.

A10. The amplifier circuit of paragraph A9, wherein the transistor cells are independently addressed to transition between the enabled state and the disabled state according to a bias voltage selectively applied to the transistor cells.

A11. The amplifier circuit of paragraph A8, wherein the at least one of the transistor cells is transitioned to the disabled state by applying a deactivating bias voltage to the at least one of the transistor cells.

A12. The amplifier circuit of paragraph A8, wherein the at least one of the transistors is transitioned between the enabled state and the disabled state by selectively applying a bias voltage to the at least one of the transistor cells.

A13. The amplifier circuit of any of paragraphs A1-A12, wherein the transistor cells of the transistor array of are coupled in parallel between the transmit signal input and the variable impedance output.

A14. The amplifier circuit of any of paragraphs A1-A13, wherein the transistor cells are packaged in a single device, optionally a transistor powerbar.

A15. The amplifier circuit of any of paragraphs A1-A14, further comprising an impedance transformer that provides a one-to-one impedance mapping between the variable impedance output and the transmit load.

A16. The amplifier circuit of any of paragraphs A1-A15, wherein the transmit load includes, optionally is, an antenna, an antenna array, and/or a phased array antenna.

B1. A transmission system, comprising:
a power amplifier that has a signal input terminal to receive an input signal, a powered signal output terminal to be coupled to a load that has changing impedances, and a transistor array of transistor cells operatively coupled in parallel between the signal input terminal and the powered signal output terminal such that one or more of the transistor cells independently is configured to amplify the input signal present at the signal input terminal and to contribute to a powered transmit signal at the powered signal output terminal; and
a transistor array controller that is configured to effect a selected load line impedance of the transistor array that corresponds to at least one of the changing impedances of the load, wherein the transistor array controller is configured to effect the selected load line impedance by selectively activating one or more of the transistor cells.

B2. The transmission system of paragraph B1, further comprising the load, wherein the load has a powered signal input terminal that is operatively coupled to the powered signal output terminal of the power amplifier.

B3. The transmission system of any of paragraphs B1-B2, wherein the one of the changing impedances of the load is a present impedance of the load.

B4. The transmission system of any of paragraphs B1-B3, wherein the transistor array controller is configured to effect the present load line impedance by selectively establishing an operating voltage for the transistor cells.

B5. The transmission system of any of paragraphs B1-B4, further comprising an operating voltage source that is configured to supply a selectable operating voltage across each of the transistor cells.

B6. The transmission system of any of paragraphs B1-B6, wherein the transistor array controller is configured to control the transistor array such that the power amplifier has an output impedance that corresponds to a/the present load impedance of the changing impedances of the load.

B7. The transmission system of any of paragraphs B1-B6, wherein the transistor array controller is configured to selectively activate individual ones of the transistor cells of the transistor array and to selectively control an/the operating voltage for all of the transistor cells such that the power amplifier has an output impedance that corresponds to a present impedance of the load.

B8. The transmission system of any of paragraphs B1-B7, further comprising a load impedance indicator to provide an indication of the at least one of the changing impedances of the load, wherein the transistor array controller is responsive to the load impedance indicator to selectively activate one or more of the transistor cells.

B9. The transmission system of paragraph B8, wherein the load impedance indicator provides the indication of the at least one of the changing impedances of the load based on an impedance measurement of the load.

B10. The transmission system of any of paragraphs B8-B9, wherein the load impedance indicator provides the indication of the at least one of the changing impedances of the load as a predetermined load input impedance indication based on one or more characteristics of the input signal.

B11. The transmission system of any of paragraphs B8-B10, wherein the load impedance indicator provides an indication of a real impedance portion of the at least one of the changing impedances of the load.

B12. The transmission system of any of paragraphs B1-B11, wherein the input signal includes plural successive signal segments and the transistor array controller is configured to selectively activate one or more different transistor cells of the transistor array during immediately successive signal segments.

B13. The transmission system of paragraph B12, wherein each of the transistor cells has a disabled state in which the transistor cell is inactivated and does not contribute to the powered transmit signal, and an enabled state in which the transistor cell is activated and contributes to the powered transmit signal, and wherein the transistor array controller is configured to transition at least one of the transistor cells between the enabled state and the disabled state independent of at least one other of the transistor cells.

B14. The transmission system of any of paragraphs B12-B13, wherein the transistor array controller is configured to independently address the transistor cells to transition between the enabled state and the disabled state according to a bias voltage selectively applied to the transistor cells.

B15. The transmission system of any of paragraphs B1-B14, wherein the transistor cells are packaged in a single device, optionally a transistor powerbar.

B16. The transmission system of any of paragraphs B1-B15, further comprising an impedance transformer that provides a one-to-one impedance mapping between the powered signal output terminal and the load.

B17. The transmission system of any of paragraphs B1-B16, wherein the transmit load includes, optionally, an antenna, an antenna array, and/or a phased array antenna.

B18. The transmission system of any of paragraphs B1-B17, wherein each of the transistor cells includes a single-stage transistor amplifier.

B19. The transmission system of any of paragraphs B1-B18, wherein each of the transistor cells includes a single transistor.

C1. A method, comprising:
receiving a transmit signal;
determining a present impedance of a transmit load that has changing impedances; and
selectively controlling, in response to the present impedance, one or more transistor cells of a transistor array, and their operating voltage, to amplify the transmit signal to a powered transmit signal and to provide the powered transmit signal to a variable impedance output with a selected output impedance corresponding to the present impedance of the transmit load, wherein the variable impedance output is coupled to the transmit load.

C2. The method of paragraph C1, wherein determining the present impedance of the transmit load includes measuring the present load input impedance of the transmit load.

C3. The method of paragraph C1, wherein determining the present impedance of the transmit load includes obtaining a predetermined load impedance indication based on one or more characteristics of the transmit signal.

C4. The method of paragraph C3, wherein determining the present impedance of the transmit load includes obtaining the predetermined load impedance indication from a stored plurality of predetermined load impedance indications based on the one or more predetermined characteristics of the transmit signal.

C5. The method of any of paragraphs C1-C4, wherein the powered transmit signal includes plural successive signal segments and selectively controlling one or more of the transistor cells of the transistor array includes selectively activating one or more different transistor cells during immediately successive signal segments.

C6. The method of any of paragraphs C1-05, wherein the transmit load has changing impedances and optionally wherein determining the present load impedance includes obtaining an indication of a real impedance portion of the changing impedances.

C7. The method of any of paragraphs C1-C6, wherein each of the transistor cells has a disabled state in which the transistor cell is inactivated and does not contribute to the powered transmit signal, and an enabled state in which the transistor cell is activated and contributes to the powered transmit signal, and wherein selectively controlling one or more transistor cells of the transistor array includes transitioning at least one of the transistor cells between the enabled state and the disabled state independent of at least one other of the transistor cells.

C8. The method of paragraph C7, wherein each of the transistor cells is independently addressable to transition between the enabled and disabled states.

C9. The method of paragraph C8, wherein at least one of the transistor cells is independently addressed to transition between the enabled and disabled states according to a gate-source voltage applied to the at least one of the transistor cells.

C10. The method of paragraph C7, wherein transitioning at least one of the transistor cells between the enabled state and the disabled state includes transitioning at least one of the transistor cells to the disabled state by setting a gate voltage of the at least one of the transistors to a value below a threshold voltage.

C11. The method of paragraph C7, wherein transitioning at least one of the transistor cells between the enabled state and the disabled state includes transitioning at least one of the transistor cells between the enabled state and the disabled state by setting a gate voltage of the at least one of the transistor cells to a value.

C12. The method of any of paragraphs C1-C11, wherein the transistor cells of the transistor array of are coupled together in parallel.

C13. The method of any of paragraphs C1-C12, wherein the transistor cells are packaged in a single device.

As used herein, the terms "selective" and "selectively," when modifying an action, movement, configuration, or other activity of one or more components or characteristics of an apparatus, mean that the specific action, movement, configuration, or other activity is a direct or indirect result of user manipulation of an aspect of, or one or more components of, the apparatus.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, the phrases "at least one of" and "one or more of," in reference to a list of more than one entity, means any one or more of the entities in the list of entities, and is not limited to at least one of each and every entity specifically listed within the list of entities. For example, "at least one of A and B" (or, equivalently, "at least one of A or B," or, equivalently, "at least one of A and/or B") may refer to A alone, B alone, or the combination of A and B.

As used herein, the singular forms "a", "an" and "the" may be intended to include the plural forms as well, unless the context clearly indicates otherwise.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only (optionally including entities other than B); in another example, to B only (optionally including entities other than A); in yet another example, to both A and B (optionally including other entities). These entities may refer to elements, actions, structures, steps, operations, values, and the like.

The various disclosed elements of systems and steps of methods disclosed herein are not required of all systems and methods according to the present disclosure, and the present disclosure includes all novel and non-obvious combinations and subcombinations of the various elements and steps disclosed herein. Moreover, any of the various elements and steps, or any combination of the various elements and/or steps, disclosed herein may define independent inventive subject matter that is separate and apart from the whole of a disclosed system or method. Accordingly, such inventive subject matter is not required to be associated with the specific systems and methods that are expressly disclosed herein, and such inventive subject matter may find utility in systems and/or methods that are not expressly disclosed herein.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A transmission system, comprising:
a power amplifier that has a signal input terminal to receive an input signal, a powered signal output terminal to be coupled to a load that has changing impedances, and a transistor array of transistor cells operatively coupled in parallel between the signal input terminal and the powered signal output terminal such that one or more of the transistor cells independently is configured to amplify the input signal present at the signal input terminal and to contribute to a powered transmit signal at the powered signal output terminal;
a transistor array controller that is configured to dynamically effect a selected load line impedance of the transistor array that corresponds to at least one of the changing load impedances of the load, wherein the transistor array controller is configured to dynamically effect the selected load line impedance by:
(i) selectively and dynamically activating one or more of the transistor cells, and
(ii) selectively and dynamically establishing an operating voltage for the transistor cells; and
a load impedance indicator to provide an indication of the at least one of the changing impedances of the load, wherein the transistor array controller is responsive to the load impedance indicator to selectively and dynamically activate one or more of the transistor cells.

2. The transmission system of claim 1, wherein the transistor array controller is configured to control the transistor array such that the power amplifier has an output impedance that corresponds to a present impedance of the load.

3. The transmission system of claim 1, further comprising a variable operating voltage source that is configured to supply a dynamically selectable operating voltage across each of the transistor cells.

4. The transmission system of claim 1, wherein the transistor array controller is configured to selectively and dynamically activate individual ones of the transistor cells of the transistor array and to selectively and dynamically control the operating voltage for the transistor cells such that the power amplifier has an output impedance that corresponds to a present impedance of the load.

5. The transmission system of claim 1, wherein the load impedance indicator provides the indication of the at least one of the changing impedances of the load based on an impedance measurement of the load.

6. The transmission system of claim 1, wherein the load impedance indicator provides an indication of a real impedance portion of the at least one of the changing impedances of the load.

7. The transmission system of claim 1, wherein the input signal includes plural successive signal segments and the transistor array controller is configured to selectively and dynamically activate one or more different transistor cells of the transistor array during immediately successive signal segments.

8. The transmission system of claim 1, wherein the transistor cells are packaged in a single transistor powerbar.

9. The transmission system of claim 1, wherein each of the transistor cells includes a single-stage transistor amplifier.

10. The transmission system of claim 1, wherein the transistor array controller is configured to maintain a constant output power of the powered transmit signal while dynamically effecting the selected load line impedance.

11. A circuit, comprising:
a transmit signal input to receive a transmit signal;
a variable impedance output to be coupled to a transmit load input of a transmit load, wherein the transmit load input has changing impedances;
a transistor array of transistor cells coupled between the transmit signal input and the variable impedance output with one or more of the transistor cells to be selectively and dynamically activated with a dynamically selected operating voltage to amplify the transmit signal to a powered transmit signal and to provide the powered transmit signal to the variable impedance output with a selected output impedance corresponding to a present impedance of the transmit load input;
a load impedance indicator to provide an indication of the present load impedance of the transmit load input; and
a transistor array controller responsive to the load impedance indicator to selectively and dynamically activate one or more of the transistor cells of the transistor array to amplify the transmit signal to the powered transmit signal and to provide the powered transmit signal to the variable impedance output with the selected output impedance corresponding to the present impedance of the transmit load input.

12. The circuit of claim 11, wherein the transmit signal includes plural successive signal segments and the transistor array controller is configured to selectively and dynamically activate one or more different transistor cells of the transistor array during immediately successive signal segments.

13. The circuit of claim 11, wherein the plural transistors of the transistor array are coupled in parallel between the transmit signal input and the variable impedance output.

14. The circuit of claim 11, wherein the transmit load includes a phased array antenna.

15. A method, comprising:
receiving an input signal;
determining a present load impedance of a load; and
selectively and dynamically controlling, in response to the present load impedance, one or more transistor cells of a transistor array of a power amplifier, and their operating voltages, to amplify the input signal to a powered transmit signal and to provide the powered transmit signal to a powered signal output terminal of the power amplifier with a selected load line impedance corresponding to the present load impedance, wherein the powered signal output terminal of the power amplifier is coupled to the load;

wherein determining the present load impedance includes measuring the present load impedance of the load.

16. The method of claim 15, wherein determining the present load impedance includes obtaining a predetermined load input impedance indication based on one or more characteristics of the input signal.

17. The method of claim 15, wherein the input signal includes plural successive signal segments and wherein the selectively and dynamically controlling the one or more transistor cells includes selectively and dynamically activating one or more different transistor cells during immediately successive signal segments.

18. The method of claim 15, wherein the one or more transistor cells includes a plurality of transistor cells, and wherein the selectively and dynamically controlling the one or more transistor cells includes:

monitoring an operational characteristic of each of one or more of the plurality of transistor cells, wherein the operational characteristic is one or more of a duty cycle, a temperature, and an active lifetime; and selectively activating a subset of the plurality of transistor cells to equalize the operational characteristics of one or more of the plurality of transistor cells.

* * * * *